United States Patent
Hong

Patent Number: 5,529,946
Date of Patent: Jun. 25, 1996

[54] PROCESS OF FABRICATING DRAM STORAGE CAPACITORS

[75] Inventor: Gary Hong, Hsinchu, Taiwan

[73] Assignee: United Microelectronics Corporation, Hsinchu, Taiwan

[21] Appl. No.: 497,270

[22] Filed: Jun. 30, 1995

[51] Int. Cl.$^6$ .................................................. H01L 21/70
[52] U.S. Cl. .................. 437/52; 437/60; 437/47; 437/919; 148/DIG. 14
[58] Field of Search .................. 437/48, 52, 60, 437/919, 47; 148/DIG. 14

[56] References Cited

U.S. PATENT DOCUMENTS

| | | | |
|---|---|---|---|
| 5,082,797 | 1/1992 | Chan et al. | 437/919 |
| 5,231,044 | 7/1993 | Jun | 437/919 |
| 5,234,858 | 8/1993 | Fazan et al. | 437/919 |
| 5,266,512 | 11/1993 | Kirsch | 437/52 |
| 5,273,925 | 12/1993 | Yamanaka | 437/919 |
| 5,286,664 | 2/1994 | Horiuchi | 437/44 |
| 5,403,767 | 4/1995 | Kim | 437/52 |
| 5,429,956 | 7/1995 | Shell et al. | 437/29 |
| 5,445,989 | 8/1995 | Lur et al. | 437/67 |

OTHER PUBLICATIONS

Kanba et al., "A 7 mask CMOS technology utilizing Liquid Phase selective oxide deposition", IEDM, 1991, pp. 637–640.

Homma et al., "A selective SiO$_2$ Film Formation technology using Liquid Phase deposition for Fully planarized multi-level Interconnections", J. Electrochem. Soc., vol. 140, No. 8, Aug. 1993, pp. 2410–2414.

Homma et al., "A new interlayer formation technology for completely planarized multilevel interconnection by using LPD", Symposium on VLSI technology, IEEE 1990, pp. 3–4.

*Primary Examiner*—Tuan H. Nguyen
*Attorney, Agent, or Firm*—Townsend and Townsend and Crew

[57] ABSTRACT

A process of fabricating the storage capacitor for a dynamic random access memory cell which includes a transistor with gate electrode and source/drain regions on a surface of a substrate. The process forms a polysilicon layer which is coupled to one of the source/drain regions, over the transistor structure. A mask is formed to cover the planned capacitor area, and then the non-masked portion of the polysilicon layer is removed. Liquid phase deposition oxide is formed on the area not masked by the mask, and then the mask is stripped. A polysilicon sidewall spacer is formed on the sidewalls of the LPD oxide, and connects with the remaining polysilicon layer to jointly form a first capacitor electrode. The LPD oxide is removed, followed by forming a dielectric layer along the surface of the first capacitor electrode. A second capacitor electrode made from polysilicon is formed along the surface of the dielectric layer to complete the storage capacitor structure.

11 Claims, 6 Drawing Sheets

PROCESS OF FABRICATING DRAM STORAGE CAPACITORS

BACKGROUND OF THE INVENTION

The present invention relates to a DRAM (Dynamic Random Access Memory) integrated circuit (IC) fabrication, and more particularly to a process of fabricating DRAM capacitors by utilization of liquid phase deposition (LPD) technology.

Dynamic RAMs are well-known memory ICs in this art. Large dynamic RAMs commercially available typically employ the simplest dynamic memory cell including a single storage capacitor and one MOSFET (Metal-Oxide-Semiconductor Field-Effect-Transistor). FIG. 1 illustrates a schematic circuit diagram of the dynamic memory cell. As shown in the drawing, the memory cell includes a MOS transistor 10 with its gate coupled to word line WL and drain coupled to bit line BL, and a storage capacitor 12 with a first electrode coupled to the source of the transistor 10 and a second electrode coupled to ground. The transistor 10 serves as a switch to access the capacitor 12 either to charge the capacitor 12 when information is stored in the memory cell or to determine if the capacitor 12 has been charged as information is read from the memory cell. High capacitance of the capacitor is desirable to prevent loss of stored information.

A wide variety of geometries and placements of the transistor and the capacitor have been used in the past. The majority of these geometries have used transistors and capacitors which are formed horizontally with respect to the substrate surface. This orientation of the devices usually uses a great deal of surface area and therefore increases the necessary size of a memory array. FIG. 2 illustrates a cross-sectional side view of prior art DRAM cells fabricated on a silicon substrate 2. Field oxides 20 are formed in the substrate 2 to define active regions. Patterned interconnections 22 and gates 32 typically made from highly-doped polycrystalline silicon (or called polysilicon) are formed on the field oxides 20 and the active regions, respectively. Doped source/drain regions 30 are formed in the surface of the substrate 2. Patterned insulators 24 typically made from silicon dioxide are formed to surround the interconnections 22 and gates 32. First electrode (or bottom electrode) layer 34, dielectric layer 36 and second electrode (or top electrode) layer 38 for the storage capacitors are formed over the structure. The first and second electrode layers 34 and 38 are typically made from highly-doped polysilicon, and the dielectric layer 36 typically utilizes an NO (nitride-oxide) or ONO (oxide-nitride-oxide) structure.

As shown in the drawing, the capacitors are fabricated along the rugged topography of the structure resulted from the formation of transistor devices. If higher capacitance is needed, the area of the dielectric layer 36 has to be increased. In such a prior art, the only way is to spread out the dielectric layer 36 in the horizontal direction. This will inevitably cause an increase in the necessary size per memory cell. In very high density applications, it tends to further shrink the memory cell size. This prior art will be unable to provide sufficient capacitance.

SUMMARY OF THE INVENTION

The primary object of the present invention is to provide a process of fabricating storage capacitors for dynamic RAM array. The fabricating process of the present invention utilizes liquid phase deposition technology to selectively deposit thick LPD (Liquid Phase Deposition) oxide. The first electrode and dielectric for the capacitors can further extend along the sidewalls of the LPD oxide in a substantially vertical direction with respect to the surface of the substrate. This will lead to an increase in capacitance while not enlarging the memory cells.

In accordance with the present invention, a method for constructing a memory cell on a surface of a substrate, comprises the steps of:

forming a transistor having gate electrode and source/drain regions on the surface of the substrate;

forming a first conductive layer over the transistor structure, the first conductive layer being coupled to one of the source/drain regions;

forming a mask to cover a planned capacitor area, and then removing the non-masked portion of the first conductive layer;

liquid phase selective deposition of oxide on the area non-masked by the mask, and then removing the mask;

forming a conductive sidewall spacer on the sidewalls of the LPD oxide, the conductive sidewall spacer connecting with the remained first conductive layer to jointly form a first capacitor electrode;

removing the LPD oxide;

forming a storage layer along the surface of the first capacitor electrode; and forming a second capacitor electrode along the surface of the storage layer.

In accordance with one aspect of the present invention, the formation of the conductive sidewall spacer includes the steps of forming a second conductive layer over the remaining first conductive layer and the LPD oxide; and anisotropically etching the second conductive layer to form the conductive sidewall spacer.

In accordance with another aspect of the present invention, the formation of the first conductive layer includes the steps of forming an insulating layer over the transistor structure; patterning the insulating layer to open a source/drain contact window; and deposition of the first conductive layer over the patterned insulating layer and in the source/drain contact window.

In accordance with the present invention, a method for constructing a memory cell on a surface of a substrate, comprises the steps of forming a transistor having gate electrode and source/drain regions on the surface of the substrate; forming a first capacitor electrode coupled to one of the source/drain regions and including a bottom portion and a substantially upright portion extending from the periphery of the bottom portion; forming a storage layer along the surface of the first capacitor electrode; and forming a second capacitor electrode along the surface of the storage layer.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

The preferred embodiment of the present invention is illustrated in FIGS. 4(a) through 4(i) of the drawings, like numerals being used to refer to like and corresponding parts of the various drawings. FIGS. 4(a)–4(i) illustrate cross-sectional side views of the present invention throughout various processing steps. It should be noted that the following detailed description is meant to be illustrative only and not limiting. Other embodiments of the present invention will be obvious to those skilled in the art in view of the following teaching.

Figure 4A:
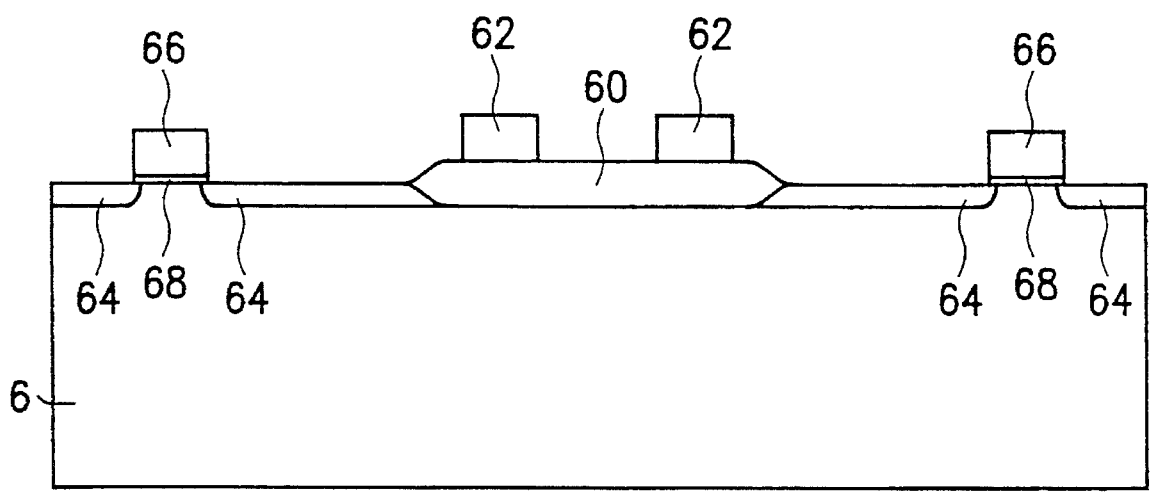
FIGS. 4(a) through 4(i) illustrate cross-sectional side views of DRAM cells after various stages of fabrication, in accordance with one preferred embodiment of the present invention.

Referring now to FIG. 4(a), there is shown a cross-sectional side view of the silicon substrate 6 after a first processing stage. As depicted in the drawing, MOS transistors are formed on the silicon substrate 6, typically by use of standard MOS technology. Specifically, patterned insulating regions 60 are formed on the silicon substrate 6, defining active regions isolated by the insulating regions 60. Typically, the insulating region 60 is formed by growing a field oxide on the silicon substrate 6, which has been masked by a patterned layer such as silicon nitride to prevent oxidation over the active region. Gate stack including a gate insulator 68 and a gate 66 is formed on the active region. Typically, the gate insulator 68 is grown at a thickness of 50–200 angstroms, and the gate 66 comprises highly doped polycrystalline silicon (or polysilicon). The gate 66 and the gate insulator 68 are etched by conventional photolithography and etch technologies to the desired configuration. In formation of the gate 66, polysilicon interconnections 62 located on the insulating region 60 may be deposited and patterned simultaneously. Source/drain regions 64 are implanted throughout the active region, but do not form under the gate stack 66, 68. For NMOS transistors, the dopant for the source/drain regions 64 may be phosphorous or arsenic. For PMOS transistors, the dopant may be boron.

Figure 4B:
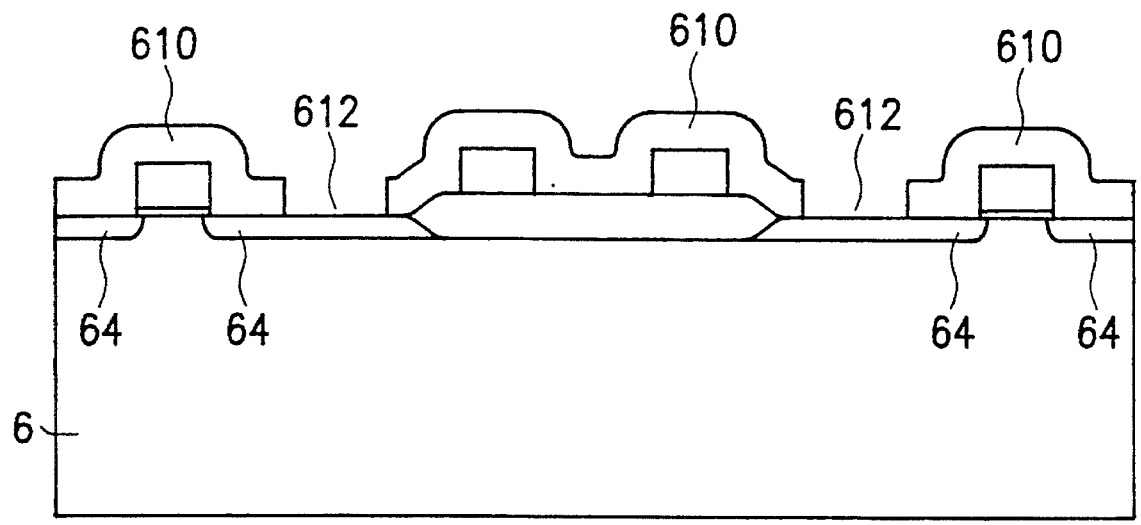

FIG. 4(b) illustrates a cross-sectional side view of the present invention after a second processing stage. An insulating layer 610 such as CVD (Chemical Vapor Deposition) oxide is deposited over the structure, and patterned by conventional photolithography and etch technologies to create contact windows 612 to the desired source/drain regions 64. It is to be noted that the structure depicted in FIG. 4(b) may be created by processes other than that described above. As such, the aforementioned processes are merely exemplary and the applicant does not intend to limit his invention thereto.

Figure 4C:
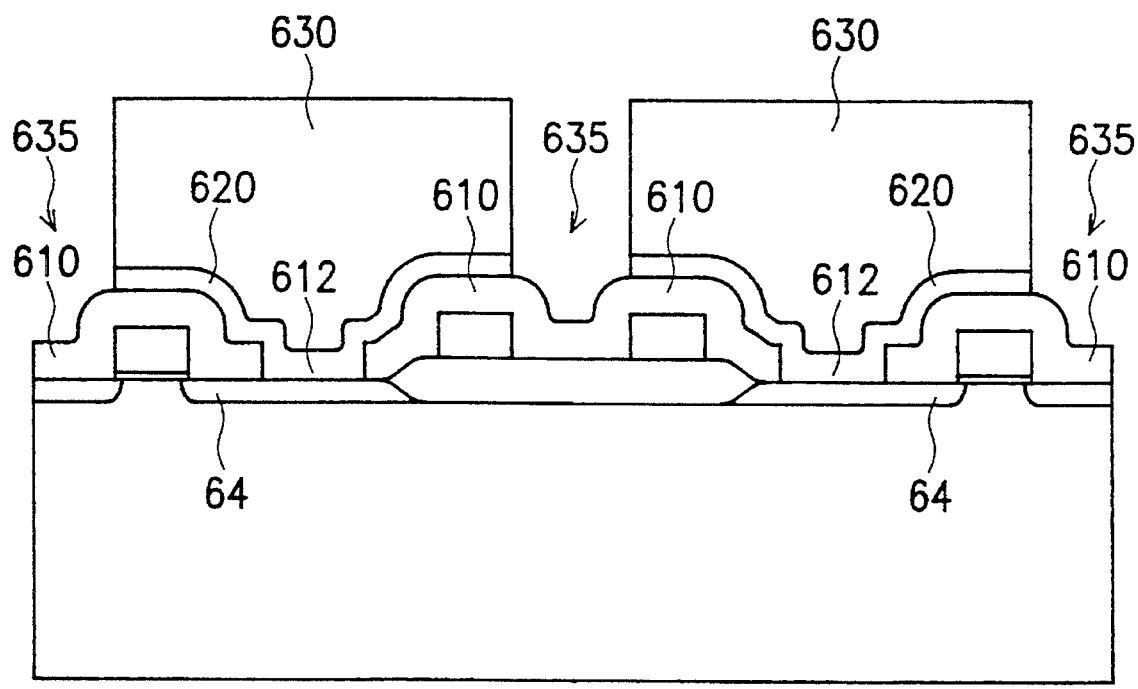

FIG. 4(c) illustrates a cross-sectional side view of the present invention following a third processing step. A first conductive layer 620 is deposited over the entire structure. Typically, the first conductive layer 620 is made from highly doped polysilicon. A mask 630, typically a photoresist layer, is formed to cover the planned storage capacitor areas. The deposited polysilicon layer 620 is then etched to remove away the non-masked polysilicon such that it remains in the contact window 612 and overlaps the adjacent insulating layer 610 by a desired distance. This patterned layer creates spaced apart polysilicon pads 620 and interim windows 635 between the polysilicon pads 620. Each polysilicon pad 620 contacts its corresponding source/drain region 64, and forms a substantially horizontal portion of the first or bottom electrode of the storage capacitor.

Figure 4D:
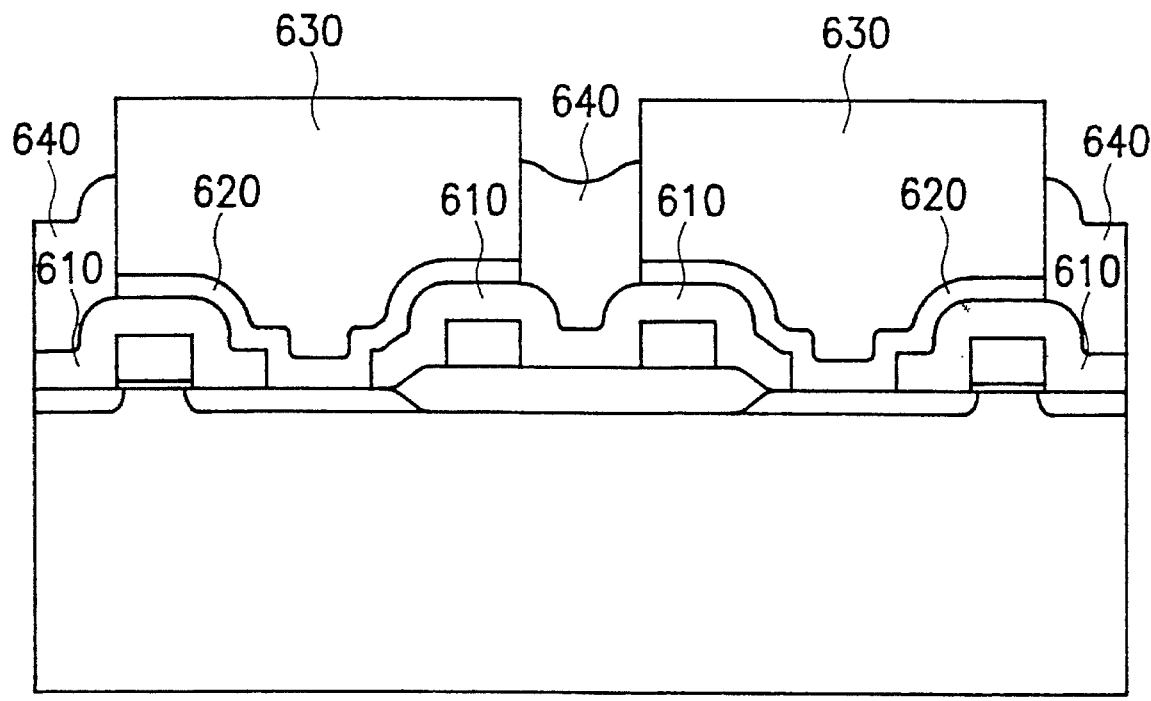

FIG. 4(d) illustrates a cross-sectional side view of the present invention after a fourth processing stage. LPD (Liquid Phase Deposition) oxides 640 are selectively deposited over the insulating layers 610 in the interim windows 635 by use of the photoresist 630 as a mask. The LPD oxides 640 typically have a larger thickness than the polysilicon pads 620. It will become clear later that the LPD oxide 640 is utilized to fabricate a substantially upright portion of the first electrode of the storage capacitor which will increase the area of the first electrode in vertical direction with respect to the surface of the substrate. In this manner, higher capacitance can be made without increasing the memory cell size. The thickness of the LPD oxide 640 will vary according to the capacitance desired for storage capacitor.

Figure 1:
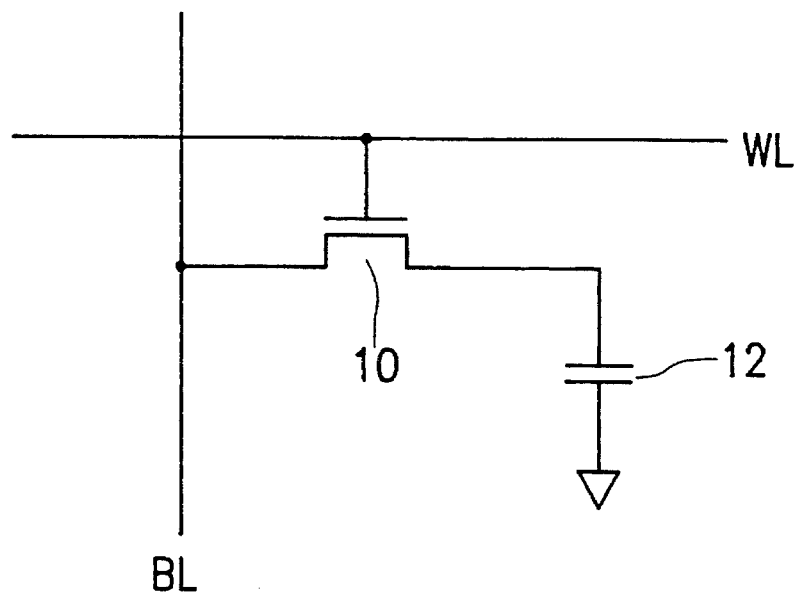
FIG. 1 illustrates a schematic circuit diagram of the simplest dynamic RAM cell.
Figure 2:
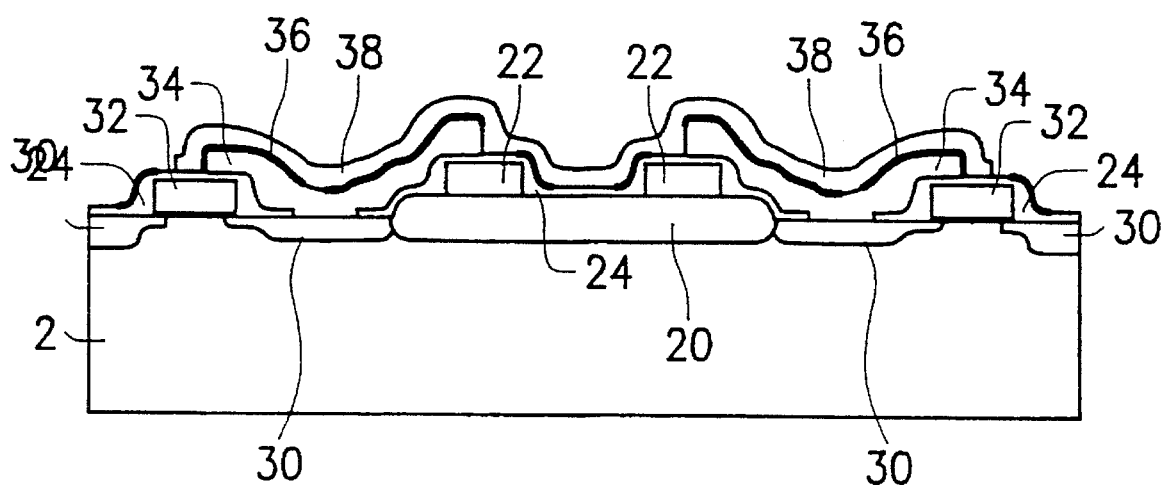
FIG. 2 illustrates a cross-sectional side view of prior art DRAM cells fabricated on a semiconductor substrate.
Figure 3:
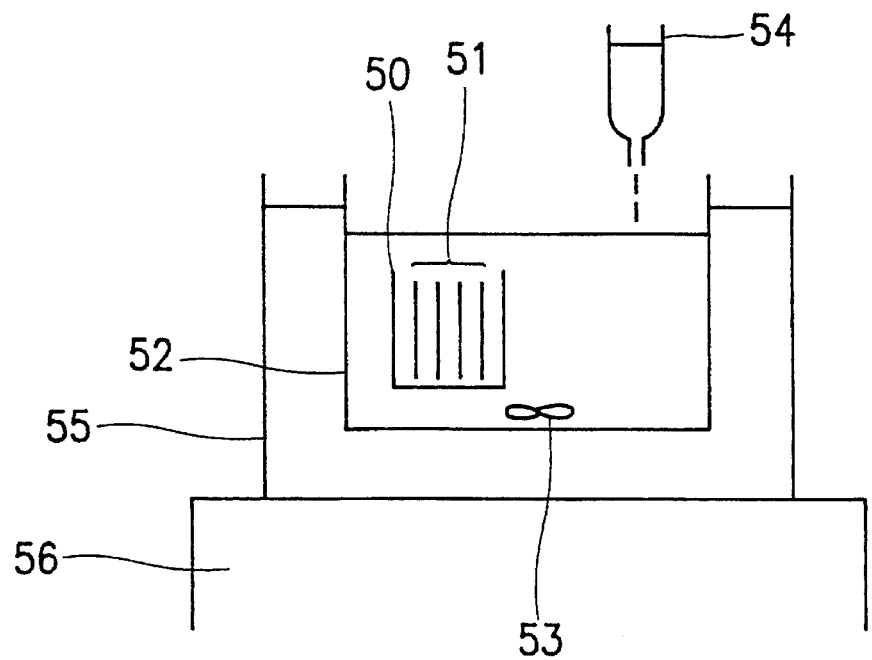
FIG. 3 illustrates a schematic diagram of a liquid phase deposition system for silicon dioxide.

The LPD oxide 640 is typically formed by utilization of the liquid phase selective oxide deposition technology. FIG. 3 shows a schematic drawing of an LPD system which can be used to carry out the LPD of $SiO_2$ films. The LPD system is equipped with a reactive vessel 52, a water bath 55, an automatically controlled dripper 54 for boric acid ($H_3BO_3$) aqueous solution, a magnetic stirrer 53, and a heater 56. A carrier 50 held wafers 51 therein is put into the reactive vessel 52. In the reactive vessel 52, a saturated hydrofluosilicic acid ($H_2SiF_6$) aqueous solution is used as the base solution. The reactive vessel 52 is warmed inside the water bath 55 which is controlled at the temperature of about 35° C. by the heater 56. To maintain the saturated $H_2SiF_6$ solution in the reactive vessel 52, $H_3BO_3$ aqueous solution is added continuously in the saturated $H_2SiF_6$ solution from the dripper 54 during the $SiO_2$ film deposition. The saturated $H_2SiF_6$ solution is stirred by the magnetic stirrer 53 to diffuse the $H_3BO_3$ solution. The reaction can be explained by the following chemical formulas:

$$H_2SiF_6 + 2H_2O \leftrightharpoons 6HF + SiO_2$$

$$H_3BO_3 + 4HF \leftrightharpoons BF_4^- + H_3O^+ + 2H_2O$$

The LPD technology has an extremely excellent deposition selectivity, and can be applied for selective deposition on silicon dioxide and polysilicon while not on other materials, such as photoresist, tungsten, etc.

Figure 4E:
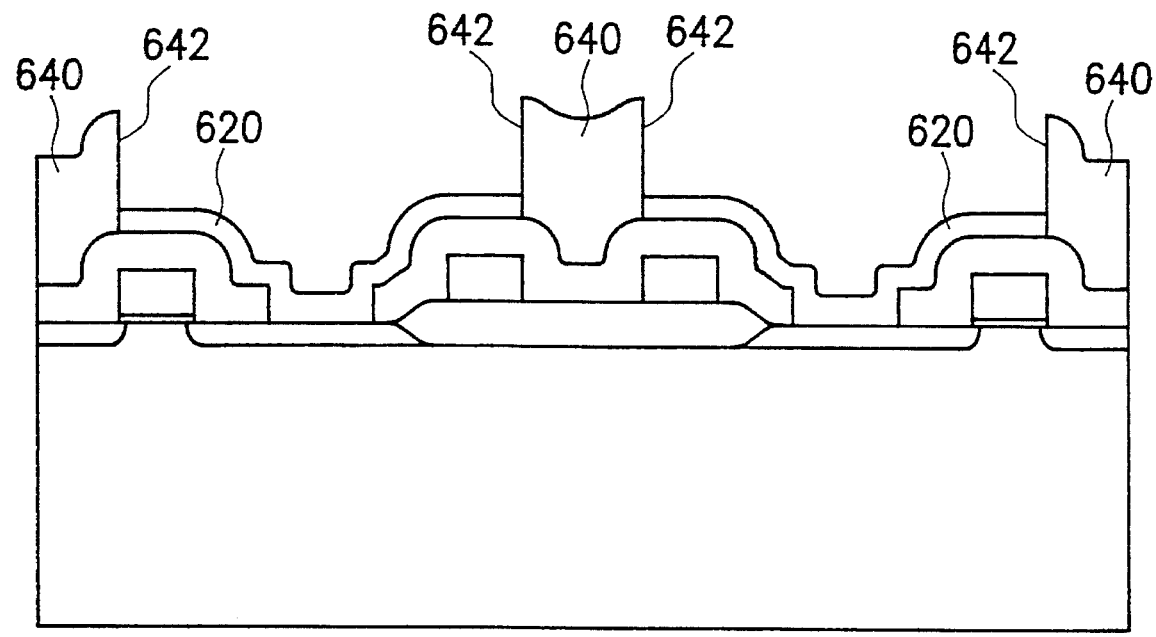

FIG. 4(e) illustrates a cross-sectional side view of the present invention following a fifth processing step. After selective deposition of the LPD oxide 640, the photoresist 630 is stripped. As shown in the drawing, the LPD oxides 640 have sidewalls 642.

Figure 4F:
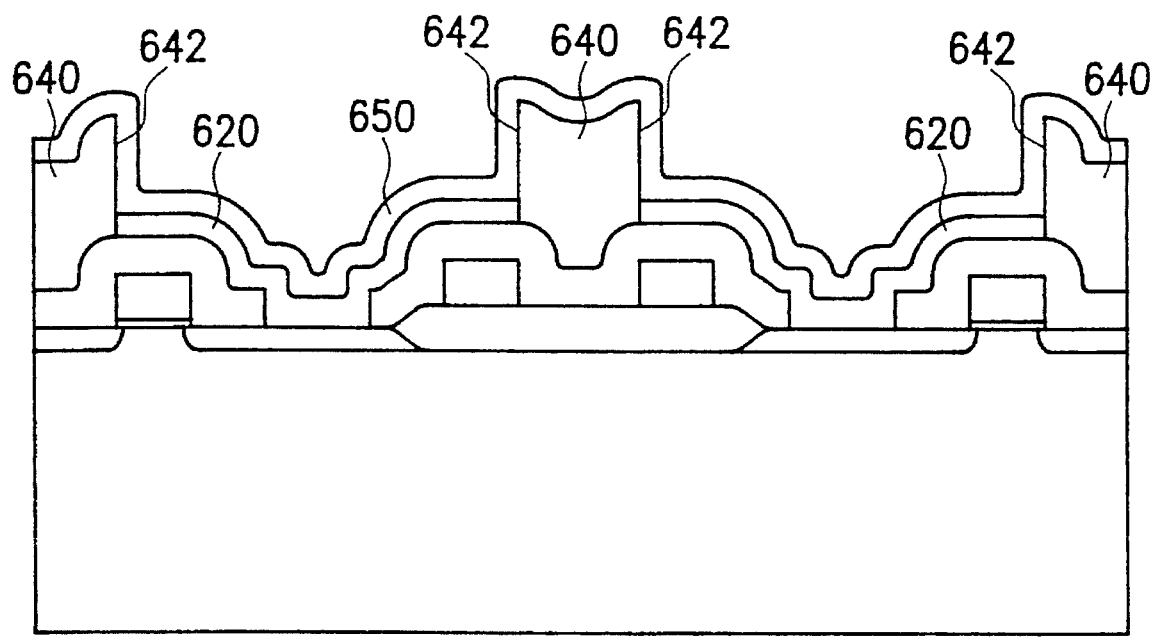

FIG. 4(f) illustrates a cross-sectional side view of the present invention after a sixth processing stage. A second conductive layer 650 is deposited over the entire structure, i.e. along the surface of the polysilicon pads 620, and the sidewalls 642 and top surface of the LPD oxides 640. Typically, the second conductive layer 650 is made from highly doped polysilicon.

Figure 4G:
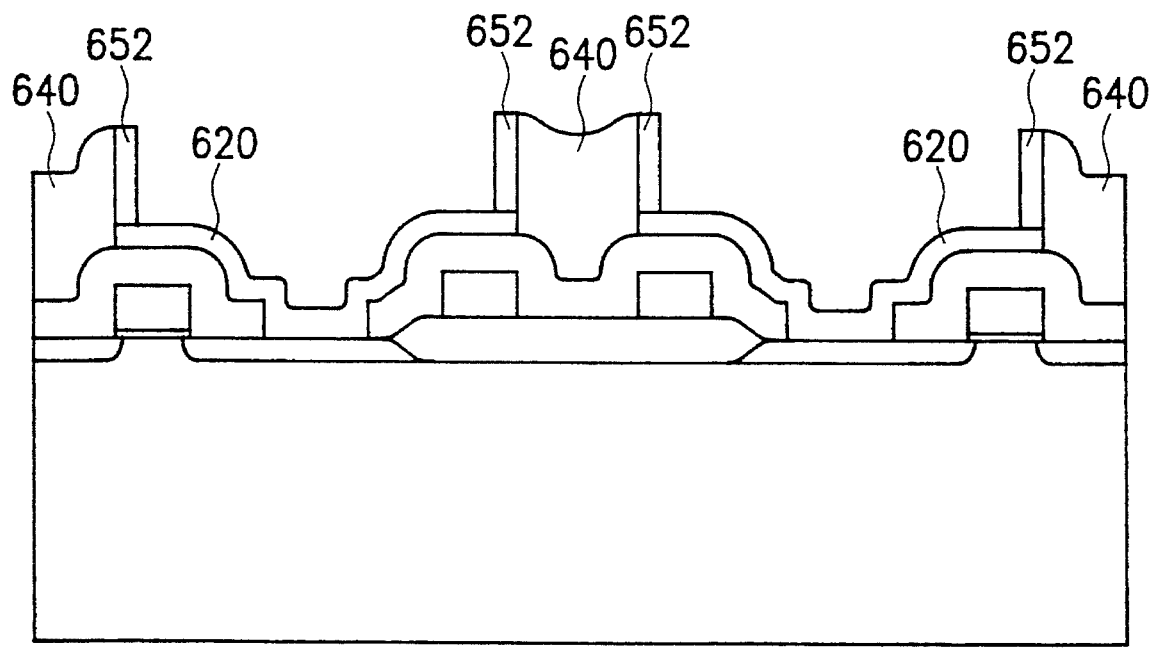

FIG. 4(g) illustrates a cross-sectional side view of the present invention after a seventh processing stage. An anisotropic etching process is then performed to etch back the second polysilicon 650 until the second polysilicon 650 over the top surfaces of the LPD oxides 640 is totally removed. This etch back procedure creates polysilicon sidewall spacers 652 on the sidewalls 642 of the LPD oxides 640, which are connected to the polysilicon pads 620, respectively. As shown in the drawing, the polysilicon sidewall spacers 652 extend upwards from the peripheries of the polysilicon pads 620, and form the substantially upright portion of the first electrode for the storage capacitor.

Figure 4H:
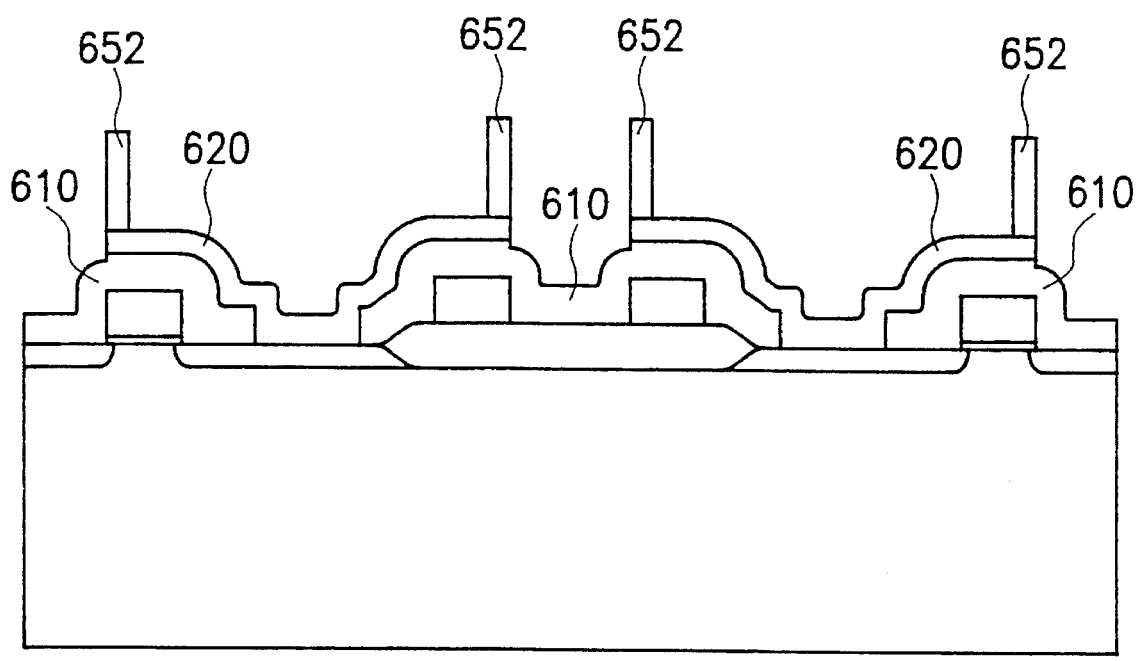

FIG. 4(h) illustrates a cross-sectional side view of the present invention following an eighth processing step. The LPD oxides 640 are removed by conventional selective etch technology. To ensure the LPD oxides 640 are fully etched away, they may be over-etched so that the insulating layers 610 underlying the LPD oxides 640 are partially removed. After this step, the first electrode of the storage capacitor is formed, and includes the substantially horizontal polysilicon pad 620 and the substantially upright polysilicon sidewall spacer 652.

Figure 4I:
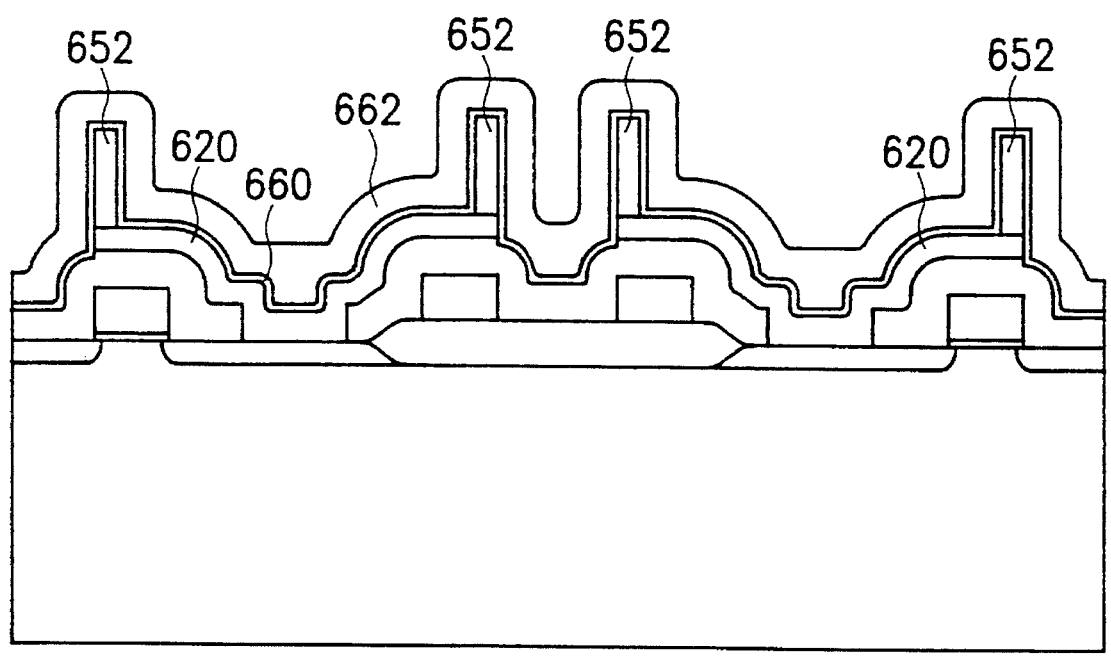

FIG. 4(i) illustrates a cross-sectional side view of the present invention after a ninth stage. A storage or dielectric layer 660 for the storage capacitor is then formed over the surface of the structure. Typically, the storage layer 660 comprises an NO (nitride-oxide) or ONO (oxide-nitride-oxide) structure. A third conductive layer 662 is deposited over the dielectric 660, and forms the second or top electrode of the storage capacitor. Typically, the third conductive layer 662 is also made from highly doped polysilicon.

Since the remaining steps in the process are standard well known steps in dynamic RAM technology, and form no part of the present invention, they will not be further described here.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for constructing a memory cell on a surface of a substrate, comprising the steps of:
   (a) forming a transistor having gate electrode and source/drain regions on said surface of said substrate;
   (b) forming a first conductive layer over said transistor structure, said first conductive layer being coupled to one of said source/drain regions;
   (c) forming a mask to cover a planned capacitor area, and then removing non-masked portions of said first conductive layer;
   (d) applying an oxide by liquid phase selective deposition over the non-masked portions of said first conductive layer, and then removing said mask to expose a sidewall defined by said oxide;
   (e) forming a conductive sidewall spacer on the sidewall of said oxide, said conductive sidewall spacer connecting with a remainder of said first conductive layer so that said sidewall spacer and remainder of the first conductive layer together form a first capacitor electrode;
   (f) removing said oxide;
   (g) forming a storage layer along the surface of said first capacitor electrode; and
   (h) forming a second capacitor electrode along the surface of said storage layer.

2. A method as claimed in claim 1, wherein in the step (e) the formation of said conductive sidewall spacer includes the steps of forming a second conductive layer over said remaining first conductive layer and said LPD oxide; and anisotropically etching said second conductive layer to form said conductive sidewall spacer.

3. A method as claimed in claim 2, wherein in the step (b) the formation of said first conductive layer includes the steps of forming an insulating layer over said transistor structure; patterning said insulating layer to open a source/drain contact window; and deposition of said first conductive layer over said patterned insulating layer and in said source/drain contact window.

4. A method as claimed in claim 3, wherein said first and second conductive layers, and said second capacitor electrode are made from highly doped polysilicon.

5. A method as claimed in claim 3, wherein said storage layer includes a nitride-oxide structure.

6. A method as claimed in claim 3, wherein said storage layer includes an oxide-nitride-oxide structure.

7. A method for constructing a memory cell on a surface of a substrate, comprising the steps of:
   forming a transistor having gate electrode and source/drain regions on said surface of said substrate;
   forming a first capacitor electrode coupled to one of said source/drain regions, said first capacitor electrode including a bottom portion and a substantially upright portion extending away from said bottom portion, the step of forming the first capacitor electrode comprising forming a conductive layer over said transistor, said conductive layer being coupled to one of said source/drain regions, forming a mask to cover a planned capacitor area, and then removing a non-masked portion of said conductive layer so that a remaining conductive layer forms said bottom portion of said first capacitor electrode, selectively depositing an oxide on the non-masked area, then removing said mask, and forming a conductive sidewall spacer on the sidewalls of said selectively deposited oxide to construct said substantially upright portion of said first capacitor electrode;
   forming a storage layer along the surface of said first capacitor electrode; and
   forming a second capacitor electrode along the surface of said storage layer.

8. A method as in claim 7, further comprising the step of removing said selectively deposited oxide before the formation of said storage layer.

9. A method as claimed in claim 8, wherein the formation of said conductive sidewall spacer includes the steps of forming a polysilicon layer over said remaining conductive layer and said selectively deposited oxide; and anisotropically etching said polysilicon layer to form said conductive sidewall spacer.

10. A method as claimed in claim 9, wherein the formation of said conductive layer includes the steps of forming an insulating layer over said transistor structure; patterning said insulating layer to open a source/drain contact window; and deposition of said conductive layer over said patterned insulating layer and in said source/drain contact window.

11. A method as claimed in claim 10, wherein said selectively deposited oxide is formed by a liquid phase deposition.

* * * * *